US011492557B2

(12) United States Patent
Lopez Andreu et al.

(10) Patent No.: US 11,492,557 B2
(45) Date of Patent: Nov. 8, 2022

(54) DEMULSIFIER CONTROL ALGORITHM FOR DUAL FREQUENCY DESALTING ELECTROSTATIC COALESCERS

(71) Applicant: Saudi Arabian Oil Company, Dhahran (SA)

(72) Inventors: Miguel Angel Lopez Andreu, Abqaiq (SA); Ramsey James White, Abqaiq (SA); Freddy Rubiano Morales, Abqaiq (SA); Sultan I. Alghamdi, Khobar (SA)

(73) Assignee: Saudi Arabian Oil Company, Dhahran (SA)

( * ) Notice: Subject to any disclaimer, the term of this patent is extended or adjusted under 35 U.S.C. 154(b) by 111 days.

(21) Appl. No.: 16/933,493

(22) Filed: Jul. 20, 2020

(65) Prior Publication Data
US 2022/0017828 A1 Jan. 20, 2022

(51) Int. Cl.
C10G 33/08 (2006.01)
C10G 33/02 (2006.01)
C10G 33/04 (2006.01)
G01K 3/04 (2006.01)
G01K 13/02 (2021.01)
G01R 19/12 (2006.01)
G01K 13/024 (2021.01)

(52) U.S. Cl.
CPC ............ *C10G 33/08* (2013.01); *C10G 33/02* (2013.01); *C10G 33/04* (2013.01); *G01K 3/04* (2013.01); *G01K 13/02* (2013.01); *G01R 19/12* (2013.01); *G01K 13/024* (2021.01)

(58) Field of Classification Search
CPC ......... C10G 33/02; C10G 33/04; C10G 33/08
See application file for complete search history.

(56) References Cited

U.S. PATENT DOCUMENTS 8,747,658 B2  6/2014 Love
10,513,912 B2  12/2019 Slocum et al.
(Continued)

FOREIGN PATENT DOCUMENTS

CN  202072669  12/2011

OTHER PUBLICATIONS

PCT International Search Report and Written Opinion in International Appln. No. PCT/US2021/042291, dated Oct. 12, 2021, 12 pages.
(Continued)

Primary Examiner — Renee Robinson
(74) Attorney, Agent, or Firm — Fish & Richardson P.C.

(57) ABSTRACT

The present disclosure describes a computer-implemented method that includes: monitoring, at a gas oil separation plant (GOSP) facility that includes a high-pressure production trap (HPPT) apparatus and a Dual Frequency Desalting (DFD) device, a plurality of parameters, wherein the plurality of parameters include one or more current measurements from the DFD device, as well as gas temperature and demulsifier concentration from the HPPT; based on the one or more current measurements, determining a rate of change of the one or more current measurements from the DFD device; and in response to the rate of change as well as the gas temperature and the demulsifier concentration, adjusting a demulsifier dosage being injected at the HPPT apparatus.

17 Claims, 8 Drawing Sheets

(56) References Cited

U.S. PATENT DOCUMENTS

| | | |
|---|---|---|
| 10,513,913 B2 | 12/2019 | Lopez et al. |
| 2003/0024579 A1 | 2/2003 | Blackmore |
| 2004/0094421 A1* | 5/2004 | Sams .................... B01D 17/06 |
| | | 204/554 |
| 2012/0024758 A1 | 2/2012 | Love |
| 2015/0090556 A1 | 4/2015 | Love |
| 2015/0175905 A1 | 6/2015 | Love |
| 2018/0195010 A1 | 7/2018 | Salu et al. |
| 2018/0371876 A1 | 12/2018 | Lopez et al. |
| 2020/0040263 A1 | 2/2020 | Syed et al. |

OTHER PUBLICATIONS

Armstrong et al., "Oil Dehydration Improved by Dual Frequency Electrostatic Process," presented at the International Petroleum Technology Conference, Dubai, U.A.E, Dec. 4-6, 2007; IPTC, 6 pages.

* cited by examiner

520 

```
┌─────────────────────────────────────────────────────────────────────┐
│ monitoring a plurality of parameters, wherein the plurality of      │
│ parameters including one or more current measurements from the DFD  │
│ device, as well as gas temperature and demulsifier concentration    │
│ from the HPPT 522                                                   │
└─────────────────────────────────────────────────────────────────────┘
```

```
┌─────────────────────────────────────────────────────────────────────┐
│ based on the one or more current measurements, determining a rate   │
│ of change of the one or more current measurements from the DFD      │
│ device 524                                                          │
└─────────────────────────────────────────────────────────────────────┘
```

```
┌─────────────────────────────────────────────────────────────────────┐
│ in response to the rate of change as well as the gas temperature    │
│ and the demulsifier concentration, adjusting a demulsifier dosage   │
│ being injected at the HPPT apparatus 526                            │
└─────────────────────────────────────────────────────────────────────┘
```

FIG. 5C

DEMULSIFIER CONTROL ALGORITHM FOR DUAL FREQUENCY DESALTING ELECTROSTATIC COALESCERS

TECHNICAL FIELD

This disclosure generally relates to control processes and apparatus in a Gas Oil Separation Plant (GOSP).

BACKGROUND

A Gas-Oil Separation Plant (GOSP) can separate water from crude oil to produce dry crude. The GOSP can achieve such separation by injecting demulsifier to separate free water using gravity separators then by using electrostatic coalescers for removing emulsified water and crude.

SUMMARY

In one aspect, the present disclosure describes a computer-implemented method that includes: monitoring, at a gas oil separation plant (GOSP) facility having a high-pressure production trap (HPPT) apparatus and a Dual Frequency Desalting (DFD) device, a plurality of parameters, wherein the plurality of parameters include one or more current measurements from the DFD device, as well as gas temperature and demulsifier concentration from the HPPT apparatus; based on the one or more current measurements, determining a rate of change of the one or more current measurements from the DFD device; and in response to the rate of change as well as the gas temperature and the demulsifier concentration, adjusting a demulsifier dosage being injected into the HPPT apparatus.

Implementations may include one or more of the following features.

The adjusting may include: when the rate of change indicates an unstable condition, ramping up the demulsifier dosage but not to exceed a maximum dosage concentration; and when the determined rate of change indicates a trend stability, ramping down the demulsifier dosage but above a minimum dosage concentration. The method may include: using a controller logic to implement a current override to affect the demulsifier concentration at the HPPT apparatus when adjusting the demulsifier dosage to mitigate the unstable condition.

The method may include: in response to determining that a separation efficiency is below a threshold value, switching off monitoring of the HPPT apparatus so that DFD device alone drives the adjusting of the demulsifier dosage. The current measurements record currents at a plurality of transformers on the DFD device. The method may further include determining an optimum demulsifier dosage based on the rate of change of the one or more current measurements at the plurality of transformers on the DFD device. Determining the optimum demulsifier dosage is further based on a gas temperature indication at the HPPT apparatus.

In another aspect, the present disclosure describes a computer system comprising a computer memory and a hardware processor interoperably coupled with the computer memory and configured to perform operations including: monitoring, at a gas oil separation plant (GOSP) facility that includes a high-pressure production trap (HPPT) apparatus and a dual frequency desalting (DFD) device, a plurality of parameters, wherein the plurality of parameters include one or more current measurements from the DFD device, as well as gas temperature and demulsifier concentration from the HPPT apparatus; based on the one or more current measurements, determining a rate of change of the one or more current measurements from the DFD device; and in response to the rate of change as well as the gas temperature and the demulsifier concentration, adjusting a demulsifier dosage being injected into the HPPT apparatus.

Implementations may include one or more of the following features.

The adjusting may include when the rate of change indicates an unstable condition, ramping up the demulsifier dosage but not to exceed a maximum dosage concentration; and when the determined rate of change indicates a trend stability, ramping down the demulsifier dosage but above a minimum dosage concentration. The operations may include: using a controller logic to implement a current override to affect the demulsifier concentration at the HPPT apparatus when adjusting the demulsifier dosage to mitigate the unstable condition.

The operations may further include: in response to determining that a separation efficiency is below a threshold value, switching off monitoring of the HPPT apparatus so that DFD device alone drives the adjusting of the demulsifier dosage. The current measurements may record currents at a plurality of transformers on the DFD device. The operations may further include: determining an optimum demulsifier dosage based on the rate of change of the one or more current measurements at the plurality of transformers on the DFD device. Determining the optimum demulsifier dosage may be further based on a gas temperature indication at the HPPT apparatus.

In another aspect, the present disclosure describes a non-transitory, computer-readable medium storing one or more instructions executable by a computer system to perform operations comprising: monitoring, at a gas oil separation plant (GOSP) facility having a high-pressure production trap (HPPT) apparatus and a dual frequency desalting (DFD) device, a plurality of parameters, wherein the plurality of parameters include one or more current measurements from the DFD device, as well as gas temperature and demulsifier concentration from the HPPT apparatus; based on the one or more current measurements, determining a rate of change of the one or more current measurements from the DFD device; and in response to the rate of change as well as the gas temperature and the demulsifier concentration, adjusting a demulsifier dosage being injected into the HPPT apparatus.

Implementations may include one or more of the following features.

The adjusting may include when the rate of change indicates an unstable condition, ramping up the demulsifier dosage but not to exceed a maximum dosage concentration; and when the determined rate of change indicates a trend stability, ramping down the demulsifier dosage but above a minimum dosage concentration. The operations may include: using a controller logic to implement a current override to affect the demulsifier concentration at the HPPT apparatus when adjusting the demulsifier dosage to mitigate the unstable condition.

The operations may further include: in response to determining that a separation efficiency is below a threshold value, switching off monitoring of the HPPT apparatus so that DFD device alone drives the adjusting of the demulsifier dosage. The current measurements may record currents at a plurality of transformers on the DFD device. The operations may further include: determining an optimum demulsifier dosage based on the rate of change of the one or more current measurements at the plurality of transformers on the DFD device. Determining the optimum demulsifier dosage may be further based on a gas temperature indication at the HPPT apparatus.

Implementations according to the present disclosure may be realized in computer implemented methods, hardware computing systems, and tangible computer readable media. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

The details of one or more implementations of the subject matter of this specification are set forth in the description, the claims, and the accompanying drawings. Other features, aspects, and advantages of the subject matter will become apparent from the description, the claims, and the accompanying drawings.

DESCRIPTION OF DRAWINGS

FIG. 5C illustrated an example of a flow chart according to an implementation of the present disclosure.

Like reference numbers and designations in the various drawings indicate like elements.

DETAILED DESCRIPTION

Figure 1:
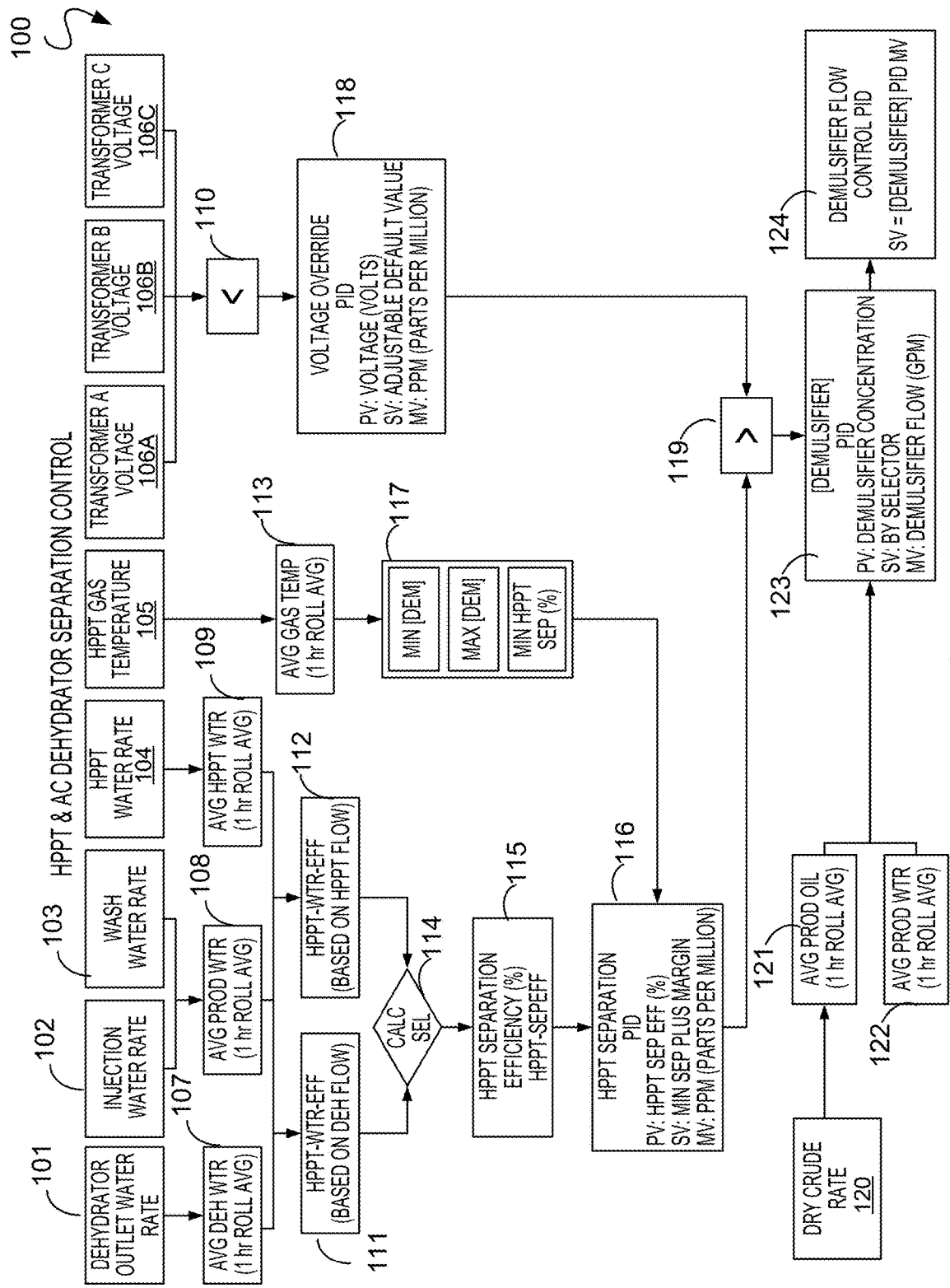
FIG. 1 illustrates an example of a Smart Demulsifier Control (SDC) architecture relevant to some implementation of the present disclosure.

The disclosed technology is directed to a Gas-Oil Separation Plant (GOSP) facility with improved feedback control. One of the primary functions of the GOSP facility is to separate water from crude oil to produce dry crude. This is achieved by separating free water using gravity separators (e.g., 3-Phase Separators also known as Production Traps) then by using electrostatic coalescers (e.g., Dehydrators and Desalters) for removing emulsified water and crude. In order to adjust the separation balance, demulsifier chemical is added to the production header. Demulsifier is a chemical that promotes water separation from the oil. The required amount of demulsifier in a GOSP facility depends upon a number of factors such as crude type, emulsion characterization, vessels design and chemical formulation effectiveness. In some cases, electrostatic coalescers use electric field to promote water separation from oil. In these cases, a particular amount of demulsifier can be introduced in the system to prevent upsets associated to the formation of rag layers around the interface of these separators. For example, using a 3-Phase separator, the separation facility can be equipped with a conventional AC coalescer that provides the voltage measurements for each transformer as feedback signals to the control system. By way of background, process upsets in the Dehydrator, which are caused by contact of the electrostatic grid to a chain of emulsion droplets between the energized grids and the vessel/ground, occasionally occur. When this happens, a de-energization is detected in the grids voltage. For conventional AC coalescers, no monitoring signals are available for Operations to check the operational condition on the water/oil layer in a proactive manner unless an interface level profiler is used. As a result, all operational controls are based on operating procedures as to conduct skimming operations in regular basis and maintain enough demulsifier in the system to ensure steady operation.

In comparison, implementations of the present disclosure incorporate a demulsifier control logic that uses the electric current readings (particularly the rate of change of current) of the Dual Frequency Desalting (DFD) technology as it strongly correlates to water-oil interface layer quality. By way of background, recent progress in electrostatic coalesce technologies may improve (or maximize) water separation from crude. One of these technologies is based on the utilization not only of AC fields but also the DC field. This technology is called Dual Frequency Desalting (DFD). Under the DFD technology, the feedback signals enable internal control action and therefore these feedback signals are provided to the local DFD control panel which is communicated with Distributed Control System (DCS). As discussed below, the current control logic tends to be more sensitive and hence proactive than voltage functionalities. Indeed, leveraging the electric current readings (particularly the rate of change of current) of the Dual Frequency Desalting (DFD) technology, implementations of the present disclosure can pursue a DFD monitoring logic to determine the optimum dosage based on the stability of the trends of the rate of change of current of all the DFD transformers as well as other parameters. Some cases allow switching off the HPPT separation (e.g., the 3-phase separator) monitor for cases of low separation. In these cases, the DFD Dehydrator alone will be the demulsifier driver if the HPPT apparatus is not separating sufficiently enough. Additionally, optimum dosage based on DFD monitoring is related to the overall demulsifier limits (including the minimum and maximum concentration limits). Therefore, the optimum demulsifier dosage will also depend on the current trends and the overall process temperature.

In some implementations, a typical GOSP can include equipment identified in Table 1:

TABLE 1

Typical GOSP Equipment
GOSP Equipment

| Equipment | Description |
| --- | --- |
| HPPT | The HPPT separates gas at high pressure (for example, 150-450 psig) from the crude oil. It can operate as a three-phase separator to separate free water also. |
| Demulsifier Injection Skid | This demulsifier injection skid injects demulsifier chemical at the production header. Demulsifier breaks emulsions to allow for separation of free water in the high-pressure production trap and assist in crude desalting. |

TABLE 1-continued

Typical GOSP Equipment
GOSP Equipment

| Equipment | Description |
|---|---|
| LPPT | The low pressure production trap (LPPT) separates gas at low pressure (for example, 50 psig) from the crude oil. |
| Charge Pumps | The charge pumps pressure the crude oil from the LPPT to discharge into the crude oil desalting train. |
| Dehydrator | The dehydrator, which receives crude from the charge pumps, is the first stage electrostatic coalescer of the desalting train to remove the bulk emulsions from the crude oil under an electrostatic field. |
| Mixing Valve Station | The mixing valve station shears injection wash water to mix with residual produced water. This will bring the average salinity of the water in the oil. |
| Desalter | The desalter is the second-stage electrostatic coalescer of the desalting train. It removes the remaining produced water along with injected wash water to produce dry and desalted crude (at 0.2% BS&W and 10 PTB) |
| WOSEP | The water-oil separator (WOSEP) de-oils the produced water from the HPPT, dehydrator and desalter to less than 100 milligrams per liter |
| Disposal Water Injection Pumps | The disposal water injection pumps discharge water into disposal wells for maintaining reservoir pressure |

The following terms apply to the present disclosure. A "demulsifier concentration" is a measurement of concentration, typically in parts per million (ppm), of demulsifier chemical in the total fluid, such as a fluid including oil and water. An "HPPT separation efficiency" is a percentage of water separated in the HPPT versus the total water removed at the GOSP. An "HPPT retention time" is a time, in minutes, for water to separate from crude in an HPPT separation compartment, such as an upstream water weir.

GOSP configurations can serve as a basis for understanding the Smart Demulsifier Control (SDC). For example, to achieve goals of the SDC scheme, it is important to consider the GOSP configuration. This is because the GOSP configuration would be used to determine the best possible control scheme, including the number of production manifolds, HPPTs, line-up options between manifolds and HPPTs, and mode of operation of each HPPT, such as whether the mode is three-phase or 2-phase. A demulsifier is normally added upstream of the HPPT through an automatic flow control.

FIG. 1 shows an example of a Smart Demulsifier Control (SDC) architecture 100, according to an implementation. In particular, the architecture 100 illustrates adjusting demulsifier injection rates to control high-pressure production trap (HPPT) separation efficiency based on, for example, AC dehydrator/desalter control. Components in the SDC architecture 100 include the following annotations. A flow indication (FI) can indicate, for example, a flow reading from flow transmitter. A temperature indication (TI) can indicate, for example, a temperature reading from temperature transmitter. A process value (PV) can indicate, for example, a value of a process variable that is being controlled. A manipulated value (MV) can indicate, for example, a controller output that triggers action of a final control element to a control process variable. A set value (SV) can indicate, for example, a desired set point of the process variable that is being controlled. The SDC architecture 200 also identifies one or more instances of a flow indication controller, a proportional integral derivative (PID) control, an hourly average (HAV), and a GOSP.

As illustrated, dehydrator outlet water rate 101 is analyzed to generate average dehydrator water rate 107. In one example, the average dehydrator water rate is represented by a rolling average on a 1-hour basis (107). Injection water rate (102) and wash water rate (103) are combined to generate average production water rate (108). In one example, the average produced water rate is a rolling average on a 1-hour basis. HPPT water rate 104 can lead to a rolling average of the water flow rate from the HPPT (109). The rolling average can be on an hourly basis. Dehydrator water rate 107, average produced water rate 108, average HPPT water rate 109 can lead to a first HPPT water efficiency 111 that is based on dehydrator water rate and a second HPPT water efficiency 112 that is based on HPPT water rate.

The SDC architecture 100 may calculate a selection (114) of one of the two HPPT water efficiency numbers to determine a HPPT separation efficiency 115. In the meantime, HPPT gas temperature 105 is provided to generate an average gas temperature 113, for example, as a rolling average on an hourly basis. The average gas temperature (113) can drive the selection of a minimum demulsifier concentration, a maximum demulsifier concentration, and a minimum HPPT separation efficiency (117). A minimum demulsifier concentration is a minimum allowed demulsifier concentration as a function of the temperature. The concentration can provide the dynamic low output limit for PID control of HPPT separation efficiency. A maximum demulsifier concentration is a maximum allowed demulsifier concentration as a function of the temperature. The concentration provides the dynamic high output limit for PID controllers of HPPT separation efficiency and for the dehydrator voltage override. A minimum HPPT separation efficiency is a minimum separation expected at HPPT as a function of the temperature. Minimum separation efficiency can be expressed as a second-degree polynomial. However, minimum separation efficiency can be expressed in other forms depending on how the process data is curve-fitted, such as in a linear equation, exponential, power, or in other ways.

A target separation efficiency is identified that is between the minimum target separation efficiency and the maximum target separation efficiency. As an example, the HPPT separation efficiency PID controller 116 can determine the target separation efficiency using the minimum and maximum target separation efficiencies. The HPPT separation efficiency PID controller 116 can control the separation of water from oil in an HPPT, such as with an "HPPT Separation Efficiency (%)." Voltage 106A from transformer A, voltage 106B from transformer B, voltage 106C from transformer C are provided to a low value calculation (110) and then used in a voltage override PID controller 118. The output of the HPPT separation efficiency PID controller 116 and the output of voltage override PID controller 118 can be used in a high value calculation (119) for the set point of the demulsifier concentration PID controller 123. The demulsifier concentration can be increased if the separation efficiency is lower than the set point. It can be decreased if separation efficiency is greater than the set point. Demulsifier concentration limits, including maximum and minimum, can be determined based on site-specific process correlations.

A dry crude rate 120 can indicate a total produced oil rate from the GOSP. The dry crude rate 120 can be used to generate a one-hour rolling average produced dry oil 121. Average produced dry oil 121 and average produced water 122, both in hourly average, can feed the demulsifier PID controller 123, which has received the set point from the high value calculation 119. Notably, average produced water 122 and average production water rate 108 can form one stream of data. The demulsifier PID controller 123 can drive a demulsifier flow controller PID 124 that provides a demulsifier flow control loop. The flow can be automatically adjusted based on a flow set point of a demulsifier PID controller 123. Output of the demulsifier concentration PID controller 123 is the set point of the demulsifier flow controller PID 124.

The example from FIG. 1 incorporate feedback signals from conventional AC coalescers which only provide voltage measurements for each transformer. Process Upsets in the Dehydrator/Desalter, which are caused by contact of the electrostatic grid to a chain of emulsion droplets between the energized grids and the vessel/ground, do occur. As discussed above, for conventional AC coalescers, no monitoring signals are available for Operations to check the operational condition on the water/oil in a proactive manner. As a result, all operational controls are based on operating procedures as to conduct skimming operations in regular basis and maintain enough demulsifier in the system to ensure steady operation. Electrostatic coalescer interface quality measurement can also be measured using profilers. Two types of technologies may be used: nuclear and capacitance based technologies. By way of illustration, a nuclear based approach may involve the use of radiative materials.

Recent advances in electrostatic coalescer technology have opened the feasibility of providing more information to the control system which monitor the operational status of each transformer. For illustration, the transformer notches the voltage up to operator settings to create the electromagnetic fields needed to polarize the water droplets. Electricity is channeled through the transformers to the plates (or grids) through the bushings of the transformer. Based on the observation of dynamic behavior of the transformers current reading, some implementations incorporate a control algorithm which uses the rate of change of the transformers current signals as a controlled variable to adjust the demulsifier concentration in the production header. When an emulsion layer starts to grow on the coalescer oil-water interface, a current consumption increase is measured. This current increase can be detected before the upset de-energizes the grids, thereby improving the chemical consumption and increasing the maximum potential benefit of the upgraded dehydration technology. The control algorithm can be retrofitted to the controller architecture of FIG. 1, as further exemplified by FIG. 2, so that the same limits and temperature effects can be used for the demulsifier requirement determination.

Figure 2:
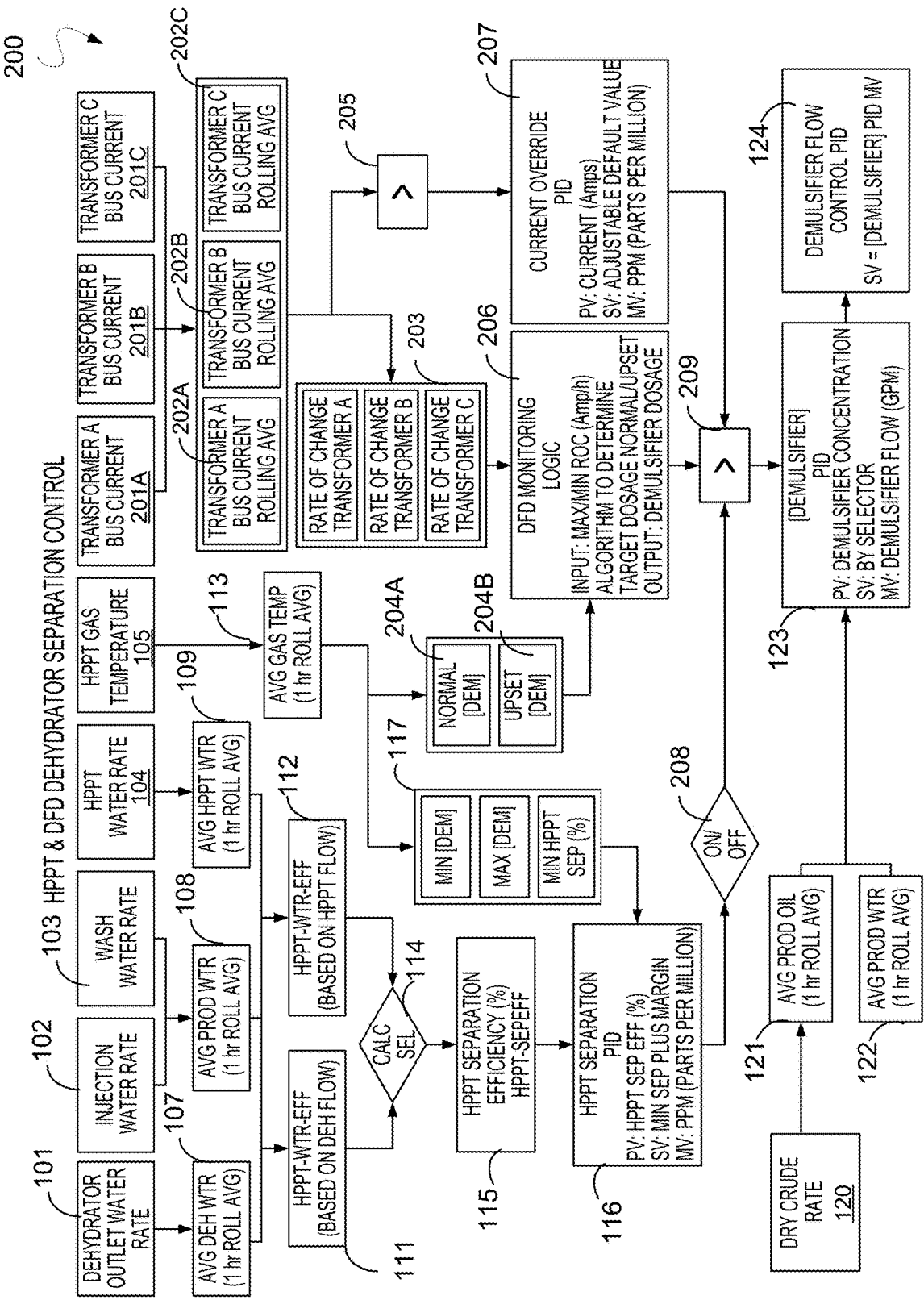
FIG. 2 illustrates another example of a modified Smart Demulsifier Control (SDC) architecture according to an implementation of the present disclosure.
Figure 3:
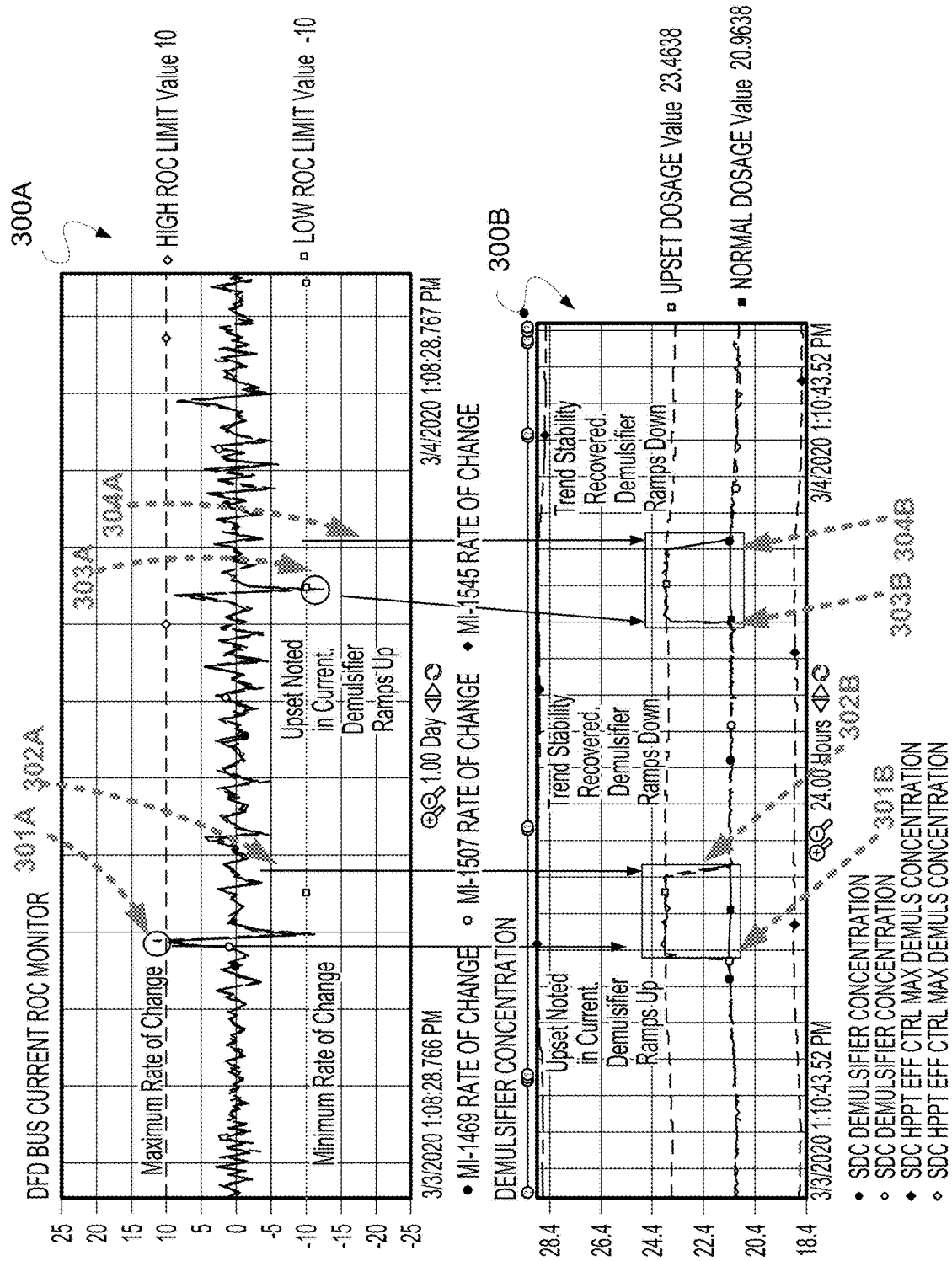
FIG. 3 illustrates an example of the performance of the controller logic according to an implementation of the present disclosure.
Figure 4:
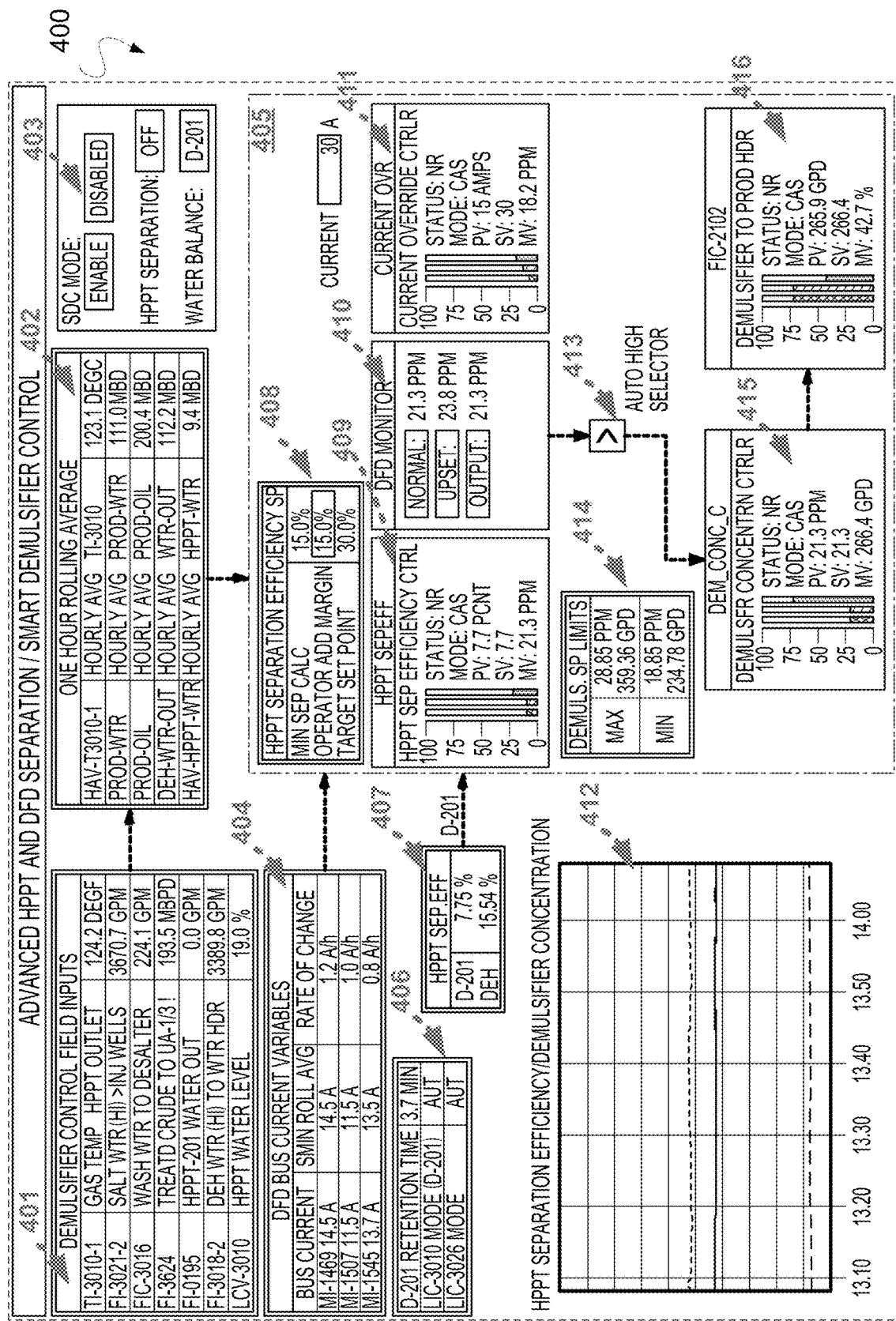
FIG. 4 illustrate examples of a control interface according to an implementation of the present disclosure.

Further referring to FIG. 2, a block diagram illustrates an example of smart demulsifier control (SDC) architecture 200, according to an implementation. As illustrated, the SDC architecture 200 includes DFD monitoring logic 206 and current override PID controller 207 to take full advantage of the measurements from the DFD technology (i.e. the current) and adjust the upstream demulsifier injection to ensure the crude desalting process is more efficient and less prone to upsets from a build-up of crude oil emulsions caused by a lack of demulsifier injection. While the DFD technology does not facilitate the current measurement in of itself, rather it is equipped with current measurement instruments to do so.

To further illustrate, dehydrator outlet water rate 101 is processed to generate average dehydrator water rate 107 (for example, a rolling average on a 1-hour basis). Injection water rate (102) and wash water rate (103) are combined to generate average production water rate 108 (for example, a rolling average on a 1-hour basis). HPPT water rate 104 can lead to a rolling average of the water flow rate from the HPPT (109). Dehydrator water rate 107, average produced water rate 108, average HPPT water rate 109 can lead to a first HPPT water efficiency 111 that is based on dehydrator water rate and a second HPPT water efficiency 112 that is based on HPPT water rate. The SDC architecture may calculate a selection (114) of one of the two HPPT water efficiency numbers to determine a HPPT separation efficiency 115. In the meantime, HPPT gas temperature 105 is provided to generate an average gas temperature 113 (for example, a rolling average on an hourly basis). The average gas temperature 113 can drive the selection of a minimum demulsifier concentration, a maximum demulsifier concentration, and a minimum HPPT separation efficiency. The average temperature 113 can further determine a normal demulsifier concentration 204A and an upset of the demulsifier concentration 204B.

In more detail, architecture 200 receives data encoding bus current on transformer A (201A), bus current on transformer B (201B), and bus current on transformer C (201C). A rolling average 202A is generated based on the bus current 201A from transformer A. In some cases, the rolling average 202A may be an average over a period of 5 minutes. Similarly, a rolling average 202B is generated based on the bus current 201B from transformer B, and a rolling average 202C is generated based on the bus current 201C from transformer C. Rolling averages 202A, 202B, and 202C can be further processed to generate the respective rate of change from each transformer (203). The respective rate of change from each transformer, as well as the normal demulsifier concentration 204A and upset of demulsifier concentration 204B, can drive the DFD monitoring logic 206. In some cases, the DFD monitoring logic 206 may implement a control algorithm that operates on input of the max/min rate of change of the current being monitored (e.g., amp per hour) to determine a target dosage that comports with the normal concentration 204A and upset concentration 204B. The DFD monitoring logic 206 may output a target demulsifier dosage to control block 209. The respective rate of change from each transformer can drive current override PID controller 207. The current override PID controller may likewise generate a limit demulsifier dosage to control block 209. As illustrated, the HPPT separation efficiency PID controller 116 can determine the target separation efficiency using the minimum and maximum target separation efficiencies. The HPPT separation efficiency PID controller 116 can control the separation of water from oil in an HPPT, such as with an "HPPT Separation Efficiency (%)." The output of the HPPT separation efficiency PID controller 116 can be provided to control block 209 through a switch 208.

The control block 209 may select the larger value of the outputs from the DFD monitoring logic 206, current override PID controller 207, and the HPPT separation efficiency PID controller 116. The output of control block 209 can thus provide for the set point of the demulsifier concentration PID controller 123. The demulsifier concentration can be increased if the separation efficiency is lower than the set point. It can be decreased if separation efficiency is greater than the set point. Demulsifier concentration limits, including maximum and minimum, can be determined based on site-specific process correlations. A dry crude rate 120 can indicate a total produced oil rate from the GOSP. The dry crude rate 120 can be used to generate a one-hour rolling average produced dry oil 121. Average produced dry oil 121 and average produced water 108, both in hourly average, can feed the demulsifier PID controller 123, which has received the set point from the high value calculation 119. The demulsifier PID controller 123 can drive a demulsifier flow controller PID 124 that provides a demulsifier flow control loop. The flow can be automatically adjusted based on a flow set point of a demulsifier PID controller 123. Output of the demulsifier concentration PID controller 123 is the set point of the demulsifier flow controller PID 124.

One advantage associated with this implementation is the ability to ensure crude quality. For example, the demulsifier dosage is optimized in this process because it is not continuously over-injected to ensure that no upsets occur. Indeed, by replacing the voltage override functionality by the current override controller function, which is more sensitive, implementations of the DFD monitoring logic 206 can more judiciously determine the optimum dosage based on the stability of the trends of the rate of change of current of all the DFD transformers. Here, the optimum dosage based on DFD monitoring is related to the overall demulsifier limits (from minimum to maximum), which, as illustrated, depend on the current trends and the overall process temperature. Moreover, implementations incorporate the capability to switch off HPPT separation monitor for cases of low separation (where DFD Dehydrator alone will be the demulsifier driver if HPPT is not separating enough), as illustrated by switch 208.

Referring to FIGS. 3, 4, 5A and 5B, the performance of the controller logic can be observed as per below. The top panel 300A shows the rate of current changes within a range, from a minimum rate of change to a maximum rate of change, during a monitoring window. The rate of current changes is based on bus current being monitored. The bottom panel 300B shows demulsifier concentration during the monitoring window. When the rate of current change reaches a maximum (301A), an upset is noted in the demulsifier concentration (301B). In other words, the demulsifier concentration ramps up at a time point that corresponds to the instant when the rate of current changes reaches the maximum value. When the trend of rate change stabilizes (302A), the demulsifier concentration ramps down (302B). Similarly, when the rate of current change hits a minimum value (303A), a demulsifier concentration ramp up is noted when the demulsifier concentration hits an upset dosage value (303B). After the ramp-up, when the trend stability recovers, the demulsifier concentration returns to a normal dosage value (304B). In summary, if the dehydrator signals (e.g., the rate of current change) show a steady trend, the demulsifier dosage is maintained within the defined window and is affected only by the process temperature and the GOSP oil and water rates. If the dehydrator signal becomes unstable, then the dosage of demulsifier will ramp to an upset condition in order to prevent a build-up of rag layer around the interface. Once the feedback signals are normalized, the system reverts back the dosage in a gradual manner.

Such dynamics thus introduces a predictive function as the controller logic can adjust the demulsifier addition before an actual de-energization (e.g., voltage drop) event happens. In some implementations, the controller logic is built in such a way that the controller logic will be tracking the actual demulsifier concentration if the scheme is not connected. Once the main logic is connected, a ramp block will set the target (Normal or Upset) based on the measured DFD trends. A DCS screen can be created in order to monitor the control scheme performance at the GOSP, as shown in the example of a control interface 400 in FIG. 4. The control interface 400 can be implemented in a number of tools, such as a LabView. The control interface includes a tab for demulsifier control field inputs 401. The control field inputs 401 may include gas temperature at the HPPT outlet, salt water flow rate in GPM (gallons per minute), wash water to desalter flow rate, treated crude flow rate, water flow rate when exiting HPPT, dehydrator water flow rate, and HPPT water level. The variables from the control field inputs 401 can generate rolling averages 402, for example, rolling on a 1-hour basis. The interface includes a control panel 403 for SDC mode, which allows an operator to enable or disable the SDC mode. The control panel 403 further indicates whether HPPT separation is deactivated (OFF) or activated (ON). The control panel 403 may additionally indicate a water balance for a particular configuration.

The control interface 400 may include a panel 404 for measured current values from the bus of a DFD apparatus. The panel 404 may include measured current values from various locations on the grid, the corresponding rolling averages of the measured current values, and the corresponding rates of change. Panel 406 shows retention time for the particular water balance from control panel 403. Panel 407 shows HPPT separation efficiency values for a number of configurations, including D-201.

The output of panel 402, panel 404, and panel 407 are coupled to controller block 405. Controller block 405 includes panel 408, panel 409, DFD monitor panel 410, current override panel 411, demulsifier limit panel 414, demulsifier concentration panel 415, and flow indication controller (FIC) panel 416. Controller block 405 further displays a current value of 30 A. Panel 408 includes a minimum separation calculation of 15%, an operator added margin of 15%, and a target set point of 30%. Panel 409 corresponds to HPPT separation efficiency control. DFD monitor panel 410 shows the set points of normal, upset and output values. Current override control panel 411 corresponds to current override control. Demulsifier limits panel 414 shows the set points of the maximum and minimum values for demulsfier dosage (ppm and gallons per day). In one illustration, the output from the DFD monitor panel couples to the demulsifier concentration panel 415 through auto high selector 413. The output of demulsifier concentration panel 415 couples to flow indication controller (FIC) panel 416.

Figure 5A:
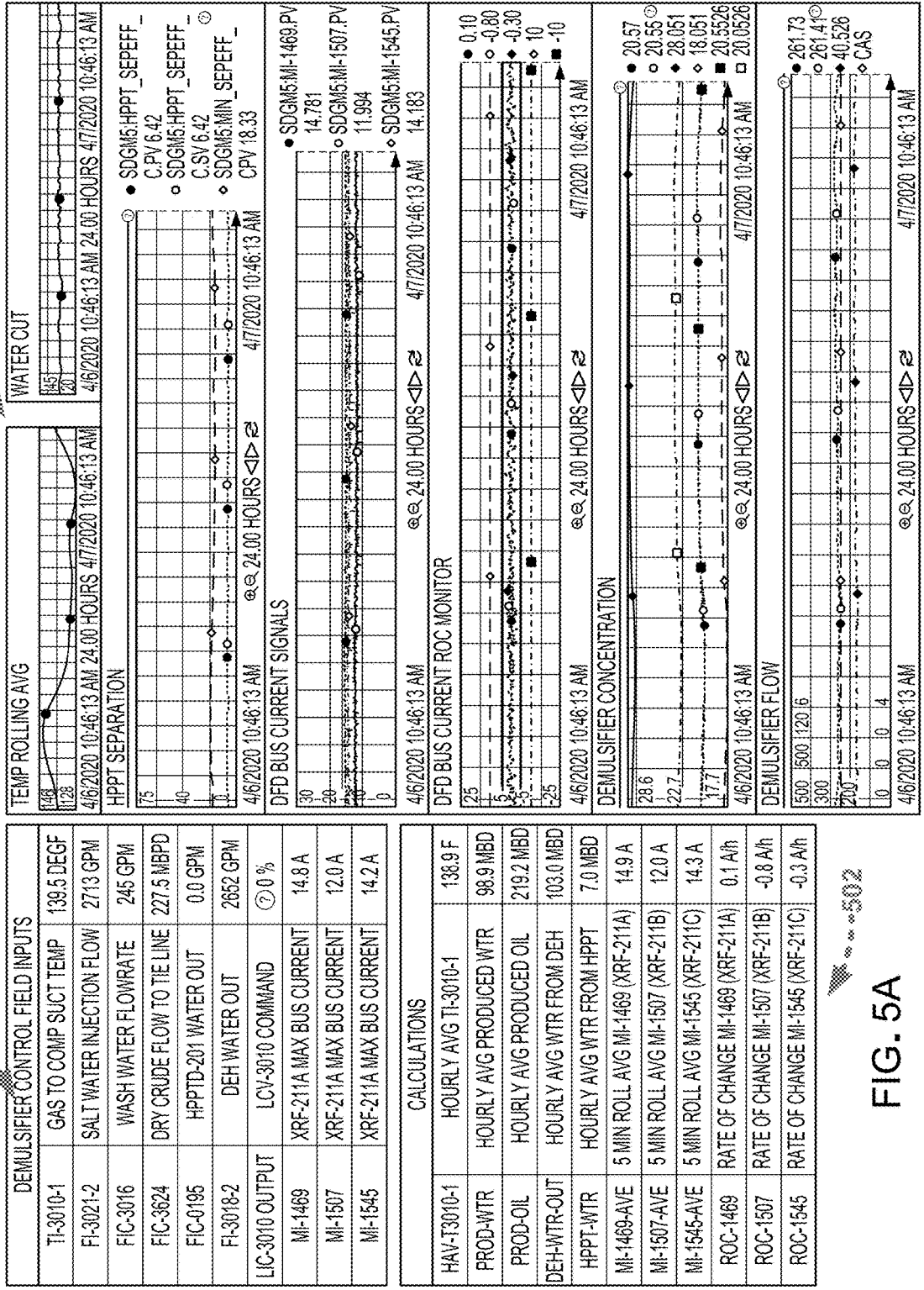
FIGS. 5A and 5B illustrate an example of a control screen according to an implementation of the present disclosure.
Figure 5B:
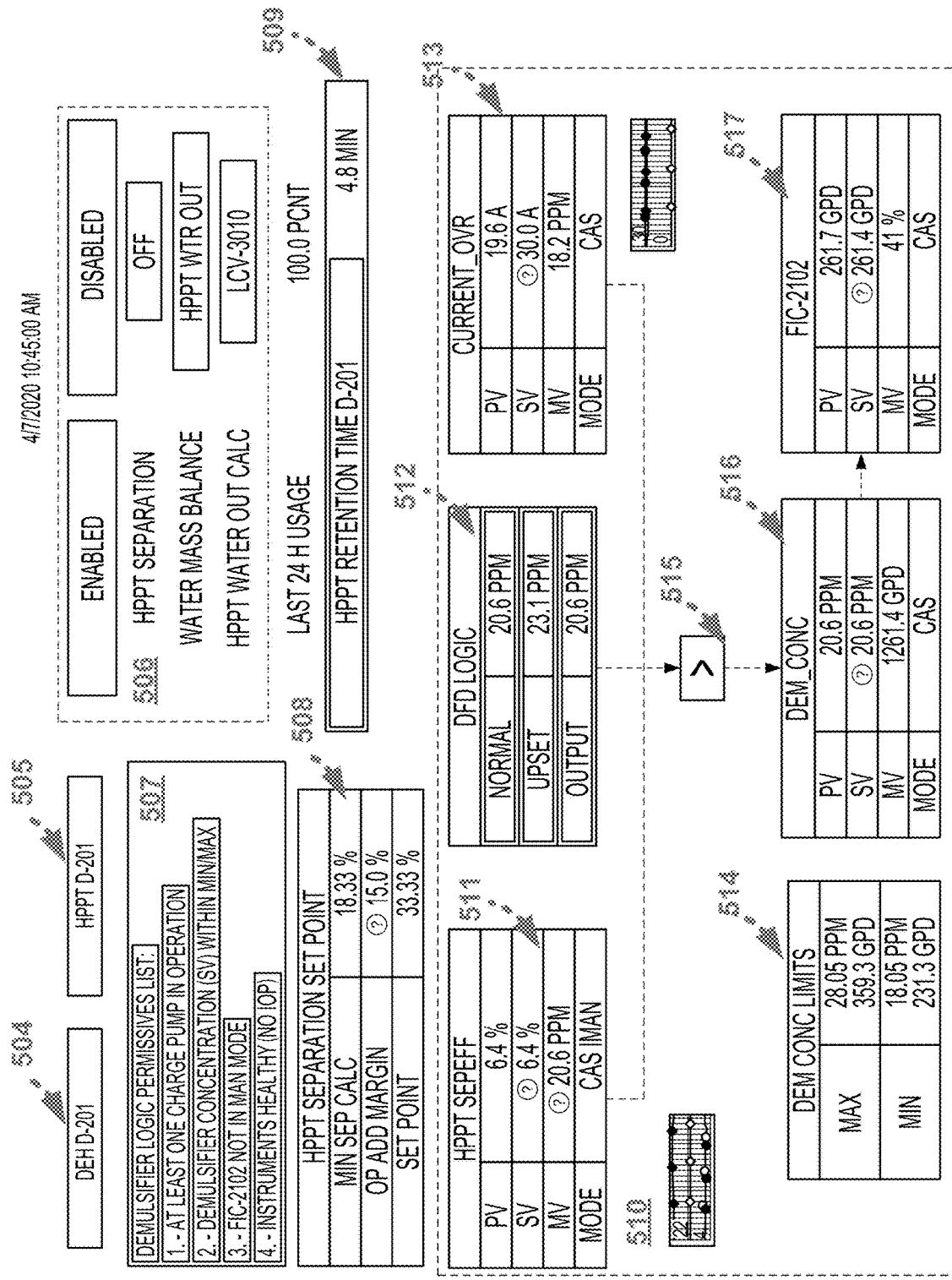

FIG. 5A-5B show an example of a Plant Information (PI) screen 500 for further monitoring by engineer. PI screen 500 includes panel 501 for demulsifier control field inputs, calculation panel 502, display panel 503, selectors 504 and 505, control panel 506, demulsifier logic list panel 507, HPPT separation set point panel 508, HTTP retention panel 509, controller logic 510. Panel 501 displays field input values including temperature, flow, flow rate, and bus current. Calculation panel can generate rolling averages (e.g., hourly or 5-min) and rate of changes. Display panel 503 displays the temporal course of various measured parameters, including, for example, rolling average of temperature, water cut, HPPT separation, DFD bus current, demulsifier concentration and flow. Control panel 506 indicates the enabled/disabled status of, for example, HPPT separation. Controller logic 510 includes, for example, HPPT efficiency panel 511, DFD logic 512, current override table 513, demulsifier concentration limits 514, demulsifier concentration 516, and FIC panel 517. The output from HPPT efficiency panel 511, DFD logic 512, current override table 513 jointly drives the demulsifier concentration panel 516 through a high value selector 515.

FIG. 5C shows a flow chart 520 according to some implementations. The flow chart reflects a computer-implemented control method at a gas oil separation plant (GOSP) facility that includes a high-pressure production trap (HPPT)

apparatus and a dual frequency Desalting (DFD) device. The control process includes monitoring a plurality of parameters, wherein the plurality of parameters including one or more current measurements from the DFD device, as well as gas temperature and demulsifier concentration from the HPPT apparatus (522). Based on the one or more current measurements, the control process may determine a rate of change of the one or more current measurements from the DFD device (524). Thereafter, in response to the rate of change as well as the gas temperature and the demulsifier concentration, the control process may adjust a demulsifier dosage being injected at the HPPT apparatus (526). When the rate of change indicates a unstable condition, the control process may ramp up the demulsifier dosage but not to exceed a maximum dosage concentration. When the determined rate of change indicates a trend stability, the control process may ramp down the demulsifier dosage but above a minimum dosage concentration. The control process may use a controller logic to implement a current override to affect the demulsifier concentration at the HPPT apparatus when adjusting the demulsifier dosage to mitigate the unstable condition. In some implementations, in response to determining that a separation efficiency is below a threshold value, the control process may switch off monitoring of the HPPT apparatus so that DFD device alone drives the adjusting of the demulsifier dosage. The current measurements may reflect currents at a plurality of transformers on the DFD device. Some implementations may determine an optimum demulsifier dosage based on the rate of change of the one or more current measurements at the plurality of transformers on the DFD device. The optimum demulsifier dosage may be further based on a gas temperature indication at the HPPT apparatus.

Figure 6:
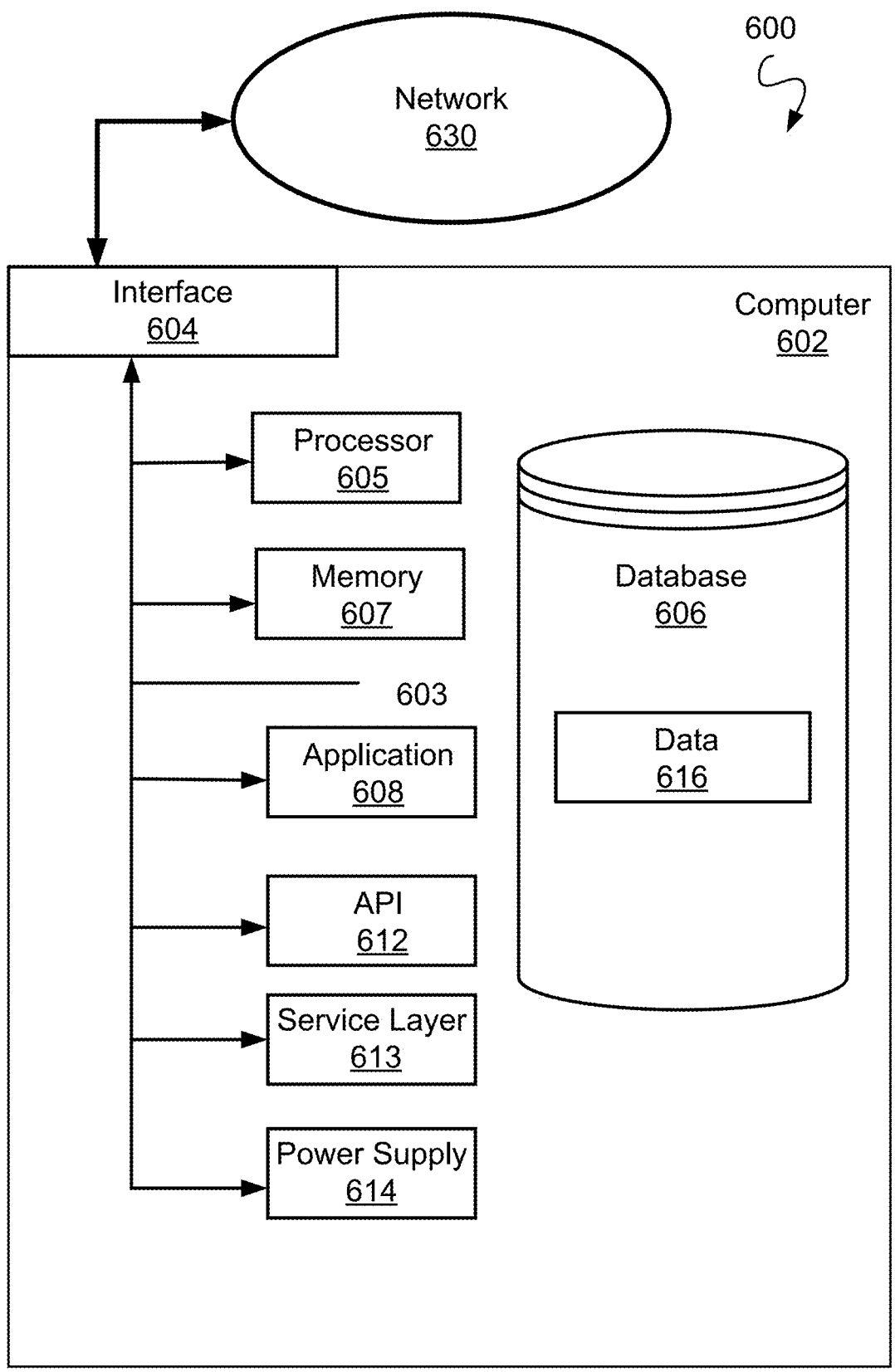
FIG. 6 is a block diagram illustrating an example of a computer system used to provide computational functionalities associated with described algorithms, methods, functions, processes, flows, and procedures, according to an implementation of the present disclosure.

FIG. 6 is a block diagram illustrating an example of a computer system 600 used to provide computational functionalities associated with described algorithms, methods, functions, processes, flows, and procedures, according to an implementation of the present disclosure. The illustrated computer 602 is intended to encompass any computing device such as a server, desktop computer, laptop/notebook computer, wireless data port, smart phone, personal data assistant (PDA), tablet computing device, one or more processors within these devices, another computing device, or a combination of computing devices, including physical or virtual instances of the computing device, or a combination of physical or virtual instances of the computing device. Additionally, the computer 602 can comprise a computer that includes an input device, such as a keypad, keyboard, touch screen, another input device, or a combination of input devices that can accept user information, and an output device that conveys information associated with the operation of the computer 602, including digital data, visual, audio, another type of information, or a combination of types of information, on a graphical-type user interface (UI) (or GUI) or other UI.

The computer 602 can serve in a role in a computer system as a client, network component, a server, a database or another persistency, another role, or a combination of roles for performing the subject matter described in the present disclosure. The illustrated computer 602 is communicably coupled with a network 630. In some implementations, one or more components of the computer 602 can be configured to operate within an environment, including cloud-computing-based, local, global, another environment, or a combination of environments.

The computer 602 is an electronic computing device operable to receive, transmit, process, store, or manage data and information associated with the described subject matter. According to some implementations, the computer 602 can also include or be communicably coupled with a server, including an application server, e-mail server, web server, caching server, streaming data server, another server, or a combination of servers.

The computer 602 can receive requests over network 630 (for example, from a client software application executing on another computer 602) and respond to the received requests by processing the received requests using a software application or a combination of software applications. In addition, requests can also be sent to the computer 602 from internal users, external or third-parties, or other entities, individuals, systems, or computers.

Each of the components of the computer 602 can communicate using a system bus 603. In some implementations, any or all of the components of the computer 602, including hardware, software, or a combination of hardware and software, can interface over the system bus 603 using an application programming interface (API) 612, a service layer 613, or a combination of the API 612 and service layer 613. The API 612 can include specifications for routines, data structures, and object classes. The API 612 can be either computer-language independent or dependent and refer to a complete interface, a single function, or even a set of APIs. The service layer 613 provides software services to the computer 602 or other components (whether illustrated or not) that are communicably coupled to the computer 602. The functionality of the computer 602 can be accessible for all service consumers using this service layer. Software services, such as those provided by the service layer 613, provide reusable, defined functionalities through a defined interface. For example, the interface can be software written in JAVA, C++, another computing language, or a combination of computing languages providing data in extensible markup language (XML) format, another format, or a combination of formats. While illustrated as an integrated component of the computer 602, alternative implementations can illustrate the API 612 or the service layer 613 as stand-alone components in relation to other components of the computer 602 or other components (whether illustrated or not) that are communicably coupled to the computer 602. Moreover, any or all parts of the API 612 or the service layer 613 can be implemented as a child or a sub-module of another software module, enterprise application, or hardware module without departing from the scope of the present disclosure.

The computer 602 includes an interface 604. Although illustrated as a single interface 604 in FIG. 6, two or more interfaces 604 can be used according to particular needs, desires, or particular implementations of the computer 602. The interface 604 is used by the computer 602 for communicating with another computing system (whether illustrated or not) that is communicatively linked to the network 630 in a distributed environment. Generally, the interface 604 is operable to communicate with the network 630 and comprises logic encoded in software, hardware, or a combination of software and hardware. More specifically, the interface 604 can comprise software supporting one or more communication protocols associated with communications such that the network 630 or interface's hardware is operable to communicate physical signals within and outside of the illustrated computer 602.

The computer 602 includes a processor 605. Although illustrated as a single processor 605 in FIG. 6, two or more processors can be used according to particular needs, desires, or particular implementations of the computer 602. Generally, the processor 605 executes instructions and manipulates data to perform the operations of the computer 602 and any algorithms, methods, functions, processes, flows, and procedures as described in the present disclosure.

The computer 602 also includes a database 606 that can hold data for the computer 602, another component communicatively linked to the network 630 (whether illustrated or not), or a combination of the computer 602 and another component. For example, database 606 can be an in-memory, conventional, or another type of database storing data consistent with the present disclosure. In some implementations, database 606 can be a combination of two or more different database types (for example, a hybrid in-memory and conventional database) according to particular needs, desires, or particular implementations of the computer 602 and the described functionality. Although illustrated as a single database 606 in FIG. 6, two or more databases of similar or differing types can be used according to particular needs, desires, or particular implementations of the computer 602 and the described functionality. While database 606 is illustrated as an integral component of the computer 602, in alternative implementations, database 606 can be external to the computer 602. As illustrated, the database 606 holds the previously described data 616 including, for example, multiple streams of data from various sources, such as demulsifier concentration, transformer bus current, gas temperature, water rate, and dry crude rate.

The computer 602 also includes a memory 607 that can hold data for the computer 602, another component or components communicatively linked to the network 630 (whether illustrated or not), or a combination of the computer 602 and another component. Memory 607 can store any data consistent with the present disclosure. In some implementations, memory 607 can be a combination of two or more different types of memory (for example, a combination of semiconductor and magnetic storage) according to particular needs, desires, or particular implementations of the computer 602 and the described functionality. Although illustrated as a single memory 607 in FIG. 6, two or more memories 607 or similar or differing types can be used according to particular needs, desires, or particular implementations of the computer 602 and the described functionality. While memory 607 is illustrated as an integral component of the computer 602, in alternative implementations, memory 607 can be external to the computer 602.

The application 608 is an algorithmic software engine providing functionality according to particular needs, desires, or particular implementations of the computer 602, particularly with respect to functionality described in the present disclosure. For example, application 608 can serve as one or more components, modules, or applications. Further, although illustrated as a single application 608, the application 608 can be implemented as multiple applications 608 on the computer 602. In addition, although illustrated as integral to the computer 602, in alternative implementations, the application 608 can be external to the computer 602.

The computer 602 can also include a power supply 614. The power supply 614 can include a rechargeable or non-rechargeable battery that can be configured to be either user- or non-user-replaceable. In some implementations, the power supply 614 can include power-conversion or management circuits (including recharging, standby, or another power management functionality). In some implementations, the power-supply 614 can include a power plug to allow the computer 602 to be plugged into a wall socket or another power source to, for example, power the computer 602 or recharge a rechargeable battery.

There can be any number of computers 602 associated with, or external to, a computer system containing computer 602, each computer 602 communicating over network 630. Further, the term "client," "user," or other appropriate terminology can be used interchangeably, as appropriate, without departing from the scope of the present disclosure. Moreover, the present disclosure contemplates that many users can use one computer 602, or that one user can use multiple computers 602.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to a receiver apparatus for execution by a data processing apparatus. The computer-storage medium can be a machine-readable storage device, a machine-readable storage substrate, a random or serial access memory device, or a combination of computer-storage mediums. Configuring one or more computers means that the one or more computers have installed hardware, firmware, or software (or combinations of hardware, firmware, and software) so that when the software is executed by the one or more computers, particular computing operations are performed.

The term "real-time," "real time," "realtime," "real (fast) time (RFT)," "near(ly) real-time (NRT)," "quasi real-time," or similar terms (as understood by one of ordinary skill in the art), means that an action and a response are temporally proximate such that an individual perceives the action and the response occurring substantially simultaneously. For example, the time difference for a response to display (or for an initiation of a display) of data following the individual's action to access the data can be less than 1 millisecond (ms), less than 1 second (s), or less than 5 s. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be, or further include special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with an operating system of some type, for example LINUX, UNIX, WINDOWS, MAC OS, ANDROID, IOS, another operating system, or a combination of operating systems.

A computer program, which can also be referred to or described as a program, software, a software application, a unit, a module, a software module, a script, code, or other component can be written in any form of programming language, including compiled or interpreted languages, or declarative or procedural languages, and it can be deployed in any form, including, for example, as a stand-alone program, module, component, or subroutine, for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network.

While portions of the programs illustrated in the various figures can be illustrated as individual components, such as units or modules, that implement described features and functionality using various objects, methods, or other processes, the programs can instead include a number of sub-units, sub-modules, third-party services, components, libraries, and other components, as appropriate. Conversely, the features and functionality of various components can be combined into single components, as appropriate. Thresholds used to make computational determinations can be statically, dynamically, or both statically and dynamically determined.

Described methods, processes, or logic flows represent one or more examples of functionality consistent with the present disclosure and are not intended to limit the disclosure to the described or illustrated implementations, but to be accorded the widest scope consistent with described principles and features. The described methods, processes, or logic flows can be performed by one or more programmable computers executing one or more computer programs to perform functions by operating on input data and generating output data. The methods, processes, or logic flows can also be performed by, and apparatus can also be implemented as, special purpose logic circuitry, for example, a CPU, an FPGA, or an ASIC.

Computers for the execution of a computer program can be based on general or special purpose microprocessors, both, or another type of CPU. Generally, a CPU will receive instructions and data from and write to a memory. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable memory storage device.

Non-transitory computer-readable media for storing computer program instructions and data can include all forms of media and memory devices, magnetic devices, magneto optical disks, and optical memory device. Memory devices include semiconductor memory devices, for example, random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Magnetic devices include, for example, tape, cartridges, cassettes, internal/removable disks. Optical memory devices include, for example, digital video disc (DVD), CD-ROM, DVD+/- R, DVD-RAM, DVD-ROM, HD-DVD, and BLURAY, and other optical memory technologies. The memory can store various objects or data, including caches, classes, frameworks, applications, modules, backup data, jobs, web pages, web page templates, data structures, database tables, repositories storing dynamic information, or other appropriate information including any parameters, variables, algorithms, instructions, rules, constraints, or references. Additionally, the memory can include other appropriate data, such as logs, policies, security or access data, or reporting files. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input can also be provided to the computer using a touchscreen, such as a tablet computer surface with pressure sensitivity, a multi-touch screen using capacitive or electric sensing, or another type of touchscreen. Other types of devices can be used to interact with the user. For example, feedback provided to the user can be any form of sensory feedback. Input from the user can be received in any form, including acoustic, speech, or tactile input. In addition, a computer can interact with the user by sending documents to and receiving documents from a client computing device that is used by the user.

The term "graphical user interface," or "GUI," can be used in the singular or the plural to describe one or more graphical user interfaces and each of the displays of a particular graphical user interface. Therefore, a GUI can represent any graphical user interface, including but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with the present disclosure), all or a portion of the Internet, another communication network, or a combination of communication networks. The communication network can communicate with, for example, Internet Protocol (IP) packets, Frame Relay frames, Asynchronous Transfer Mode (ATM) cells, voice, video, data, or other information between networks addresses.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of what can be claimed, but rather as descriptions of features that can be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features can be described as acting in certain combinations and even initially claimed as such, one or more features from a claimed combination can, in some cases, be excised from the combination, and the claimed combination can be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations can be considered optional), to achieve desirable results. In certain circumstances, multitasking or parallel processing (or a combination of multitasking and parallel processing) can be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A computer-implemented method, comprising:
    monitoring, at a gas oil separation plant (GOSP) facility that includes a high-pressure production trap (HPPT) apparatus and a dual frequency desalting (DFD) device, a plurality of parameters, wherein the plurality of parameters include measurements of transformer bus current from the DFD device, as well as gas temperature and demulsifier concentration from the HPPT apparatus;
    determining a rate of change of transformer bus current from the DFD device; and
    in response to the rate of change of transformer bus current as well as the gas temperature and the demulsifier concentration, adjusting a demulsifier dosage being injected into the HPPT apparatus such that when the rate of change of transformer bus current is above a first threshold rate indicating an unstable condition in the HPPT apparatus, ramping up the demulsifier dosage but not to exceed a maximum dosage concentration; and
    when the determined rate of change of transformer bus current is below a second threshold rate indicating a trend stability, ramping down the demulsifier dosage but above a minimum dosage concentration.

2. The computer-implemented method of claim 1, further comprising:
    using a controller logic to implement a current override to affect the demulsifier concentration at the HPPT apparatus when adjusting the demulsifier dosage to mitigate the unstable condition.

3. The computer-implemented method of claim 1, further comprising:
    in response to determining that a separation efficiency is below a threshold value, switching off monitoring of the HPPT apparatus so that DFD device alone drives the adjusting of the demulsifier dosage.

4. The computer-implemented method of claim 1, wherein the transformer bus current corresponds to currents at a plurality of transformers on the DFD device.

5. The computer-implemented method of claim 4, further comprising:
    determining an optimum demulsifier dosage based on the rate of change of transformer bus current at the plurality of transformers on the DFD device.

6. The computer-implemented method of claim 5, wherein determining the optimum demulsifier dosage is further based on a gas temperature indication at the HPPT apparatus.

7. A computer system, comprising:
    a computer memory; and
    a hardware processor interoperably coupled with the computer memory and configured to perform operations comprising:
        monitoring, at a gas oil separation plant (GOSP) facility that includes a high-pressure production trap (HPPT) apparatus and a dual frequency desalting (DFD) device, a plurality of parameters, wherein the plurality of parameters include measurements of transformer bus current from the DFD device, as well as gas temperature and demulsifier concentration from the HPPT apparatus;

determining a rate of change of transformer bus current the DFD device; and in response to the rate of change of transformer bus current as well as the gas temperature and the demulsifier concentration, adjusting a demulsifier dosage being injected into the HPPT apparatus such that when the rate of change of transformer bus current is above a first threshold rate indicating an unstable condition in the HPPT apparatus, ramping up the demulsifier dosage but not to exceed a maximum dosage concentration; and when the determined rate of change of transformer bus current is below a second threshold rate indicating a trend stability, ramping down the demulsifier dosage but above a minimum dosage concentration.

8. The computer system of claim 7, wherein the operations further comprise:

using a controller logic to implement a current override to affect the demulsifier concentration at the HPPT apparatus when adjusting the demulsifier dosage to mitigate the unstable condition.

9. The computer system of claim 7, wherein the operations further comprise:

in response to determining that a separation efficiency is below a threshold value, switching off monitoring of the HPPT apparatus so that DFD device alone drives the adjusting of the demulsifier dosage.

10. The computer system of claim 7, wherein the transformer bus current corresponds to currents at a plurality of transformers on the DFD device.

11. The computer system of claim 10, wherein the operations further comprise:

determining an optimum demulsifier dosage based on the rate of change of transformer bus current at the plurality of transformers on the DFD device.

12. The computer system of claim 11, wherein determining the optimum demulsifier dosage is further based on a gas temperature indication at the HPPT apparatus.

13. A non-transitory, computer-readable medium storing one or more instructions executable by a computer system to perform operations comprising:

monitoring, at a gas oil separation plant (GOSP) facility that includes a high-pressure production trap (HPPT) apparatus and a dual frequency desalting (DFD) device, a plurality of parameters, wherein the plurality of parameters include measurements of transformer bus current from the DFD device, as well as gas temperature and demulsifier concentration from the HPPT apparatus;

determining a rate of change of transformer bus current from the DFD device; and in response to the rate of change of transformer bus current as well as the gas temperature and the demulsifier concentration, adjusting a demulsifier dosage being injected into the HPPT apparatus such that when the rate of change of transformer bus current is above a first threshold rate indicating an unstable condition in the HPPT apparatus, ramping up the demulsifier dosage but not to exceed a maximum dosage concentration; and when the determined rate of change of transformer bus current is below a second threshold rate indicating a trend stability, ramping down the demulsifier dosage but above a minimum dosage concentration.

14. The non-transitory, computer-readable medium of claim 13, wherein the operations further comprise:

using a controller logic to implement a current override to affect the demulsifier concentration at the HPPT apparatus when adjusting the demulsifier dosage to mitigate the unstable condition.

15. The non-transitory, computer-readable medium of claim 13, wherein the operations further comprise:

in response to determining that a separation efficiency is below a threshold value, switching off monitoring of the HPPT apparatus so that DFD device alone drives the adjusting of the demulsifier dosage.

16. The non-transitory, computer-readable medium of claim 13, wherein the transformer bus current corresponds to currents at a plurality of transformers on the DFD device, and wherein the operations further comprise: determining an optimum demulsifier dosage based on the rate of change of transformer bus current at the plurality of transformers on the DFD device.

17. The non-transitory, computer-readable medium of claim 16, wherein determining the optimum demulsifier dosage is further based on a gas temperature indication at the HPPT apparatus.

* * * * *